United States Patent [19]

Collet

[11] Patent Number: 4,463,367

[45] Date of Patent: Jul. 31, 1984

[54] FRAME-TRANSFER CHARGE-COUPLED IMAGE SENSOR DEVICE HAVING CHANNEL SOUNDING REGIONS BELOW LIGHT-ADMITTING WINDOWS

[75] Inventor: Marnix G. Collet, Sunnyvale, Calif.

[73] Assignee: U.S. Philips Corporation, Tarrytown, N.Y.

[21] Appl. No.: 525,791

[22] Filed: Aug. 23, 1983

Related U.S. Application Data

[63] Continuation of Ser. No. 235,212, Feb. 17, 1981, abandoned.

[30] Foreign Application Priority Data

Feb. 19, 1980 [NL] Netherlands ......................... 8000999

[51] Int. Cl.³ .................... H01L 29/78; H01L 27/14; H01L 31/00
[52] U.S. Cl. ......................................... 357/24; 357/30
[58] Field of Search .............................. 357/24 LR, 30

[56] References Cited

U.S. PATENT DOCUMENTS 4,141,024 2/1979 Kano et al. .................... 357/24 LR
4,194,213 3/1980 Kano et al. .................... 357/24 LR

OTHER PUBLICATIONS

Abe et al., "A CCD Imager with SiO₂ Exposed Photosensor Arrays" IEEE Int. Electron Devices Meeting (12/77), pp. 542-545.

Sequin et al., *Charge Transfer Devices*, Academic Press, New York, (1975), pp. 12-15, 38, 39, 44-47.

Sequin et al., "Charge-Coupled Area Image Sensor Using Three Levels of Polysilicon" IEEE Trans. Electron Devices, vol. ED-21 (11/74), pp. 712-720.

*Primary Examiner*—Gene M. Munson
*Attorney, Agent, or Firm*—Ronald J. Meetin; Thomas A. Briody; Robert T. Mayer

[57] ABSTRACT

A charge-coupled image sensor device of the frame-transfer type has an electrode system through which windows (14) allow light to enter the device. One group of electrodes (15 and 16) extends transverse to charge transport channels (9 or 11) in the device. Another group of electrodes (18) extends parallel to the channels. Channel bounding regions (12) that electrically separate the channels lie below substantially the entire areas of the windows.

6 Claims, 13 Drawing Figures

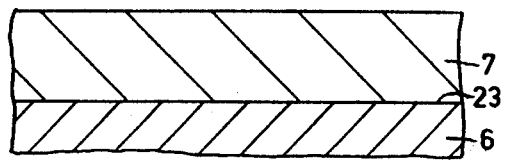
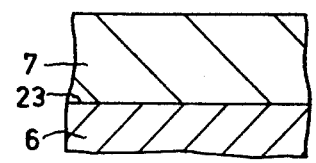
FIG.7a  FIG.7b
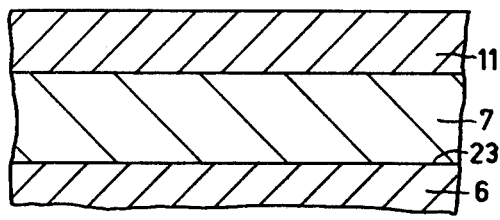
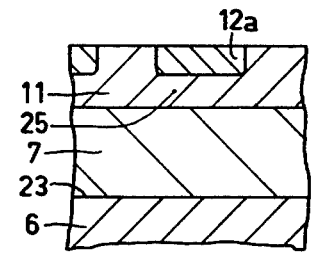
FIG.8a  FIG.8b
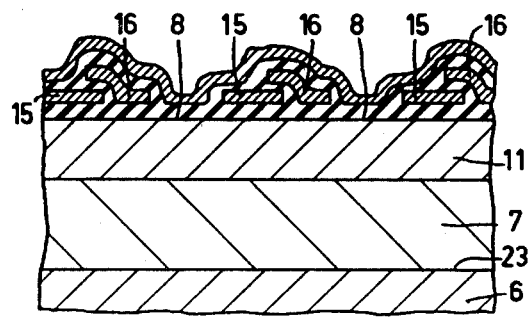
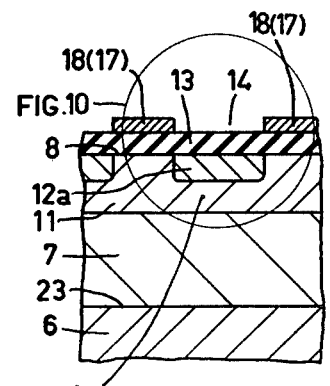
FIG.9a  FIG.9b
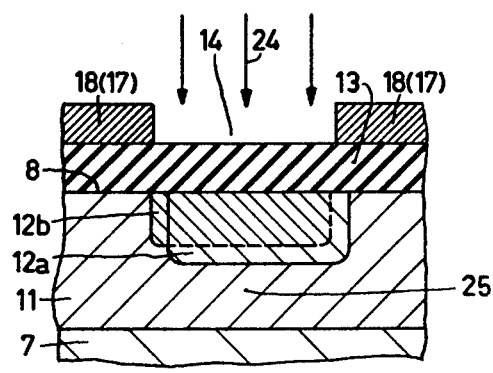
FIG.10

FRAME-TRANSFER CHARGE-COUPLED IMAGE SENSOR DEVICE HAVING CHANNEL SOUNDING REGIONS BELOW LIGHT-ADMITTING WINDOWS

This is a continuation of application Ser. No. 235,212, filed Feb. 17, 1981, now abandoned.

BACKGROUND OF THE INVENTION

1. Field of the Invention

The invention relates to a charge-coupled image sensor device for receiving a radiation image and converting the same into an electric signal, wherein a semiconductor body has a number of substantially parallel charge transport channels separated from each other at a major surface at which there is an insulating layer on which a system of electrodes is provided in behalf of the charge transport, wherein the electrode system has windows via which in particular short-wave light of the radiation image can penetrate into the semiconductor body to generate charge carriers therein, and wherein the system of electrodes comprises a first group of electrodes extending in a direction transverse to the direction of charge transport.

The invention relates in addition to a method of manufacturing such an image sensor device.

2. Description of the Prior Art

In such a device a pattern of charge packets corresponding to the radiation or exposure pattern is generated in the radiation-sensitive part and after termination of the integration period can be transferred to a storage register (frame/field transfer). The charge stored in the storage register is then shifted into a shift register line by line from which it is read serially for further processing.

By means of the system of electrodes, depletion regions can be induced in the underlying semiconductor body in which or in the proximity of which charge carriers can be generated by absorption of radiation. These charge carriers can then be stored in the depletion regions below the electrode system in the form of the above-mentioned charge packets.

The sensitivity of such a device can be detrimentally influenced by the system of electrodes. When a metal layer is used in said electrode system, the thickness of the metal must generally be very small since otherwise it becomes impervious to radiation. The provision of such thin metal layers often requires an extra manufacturing step during the production process.

Absorption (and/or reflection) by the electrode system can be prevented by using radiation on the rear side of the semiconductor body. However, this usually requires a complicated and difficult production process.

Another method of increasing the sensitivity of charge-coupled image sensor devices is the use of semiconductor material, for example, for example polycrystalline silicon, for the electrode system. Since the coefficient of absorption of silicon for radiation of shorter wavelength is comparatively high, this improvement, however, is smaller for blue light than for long-wave light.

In published Netherlands Patent Application No. 7610700 which corresponds to U.S. Pat. No. 4,141,024, a charge-coupled image sensor device is shown in which the sensitivity for blue light is increased by providing the common electrode system with windows via which the short-wave light can penetrate into the semiconductor body. These windows are obtained in that recesses adjoining each other are always provided in two successive electrodes, situated transversely to the direction of charge transport. During the manufacture of such electrodes notably during the provision of the recesses, alignment tolerances should be taken into account, which usually is at the expense of the required quantity of semiconductor surface area. Moreover, the resistance at the area of the recesses is larger than in the remainder of the electrodes so that the response time hereof is adversely influenced. Moreover, in the image sensor device shown the window portions are situated above the channel region, which may cause a loss in transport efficiency. If desired, this can be solved by providing a transparent electrode for which, however, process steps not very common in semiconductor technology are required.

SUMMARY OF THE INVENTION

It is the object of the invention to provide a charge-coupled image sensor device in which such a loss does not occur while in addition the device can be manufactured in a simple manner.

The invention is based on the recognition of the fact that this can be reached by providing the system of electrodes according to a frame pattern.

For that purpose in accordance with the invention, a charge-coupled image sensor device of the type described in the first paragraph is characterized in that the electrode system includes a second group of electrodes, each of which is associated substantially with only one charge transport channel and extends above said charge transport channel in a direction substantially parallel to the direction of charge transport and transversely to the electrodes on the first group. The electrodes of the second group are situated at distance from each other and together with the electrodes of the first group do not cover the radiation-permeable windows.

Since the windows are formed by open spaces in a frame configuration it is now no longer necessary to align recesses in various electrodes relative to each other. The electrodes of the second group associated with the charge transport channels extend above said channels so that no loss of transport efficiency occurs. At the same time the freedom arises to freely choose the dimensions of the windows within certain limits. This freedom in choice makes it possible in particular to manufacture larger windows so that notably the sensitivity to blue light can be increased.

A preferred embodiment of a charge-coupled device in accordance with the invention is characterized in that in places beyond the windows the electrode system comprises connection elements which connect electrodes of the second group together.

As a result of this a short response time of the electrode and hence a high transport speed of the device is obtained. An additional advantage is that electric contacts in behalf of the electrodes of the second group can now be situated beside those for electrodes in behalf of other clock phases. This may present technical advantages with respect to the designing, notably in the case of long charge transport channels. In addition it is achieved herewith that juxtaposed zones in various charge transport channels are driven substantially simultaneously so that a large synchronism exists between the charge transport channels mutually. This advantage also applies more strongly according as the charge transport channels and hence the electrodes of the second group become longer. The connection elements are preferably situated substantially transversely to said electrodes of the second group.

A further preferred embodiment of an image sensor device according to the invention is characterized in that the parts of the electrodes of the second group situated between the windows have a larger length than width.

In such a construction the surface of the windows can be increased considerably. This increases the sensitivity to blue light of the device.

A further preferred embodiment of an image sensor device in accordance with the invention is characterized in that the semiconductor body comprises a silicon substrate of a first conductivity type which is provided at the surface with a semiconductor region of a second opposite conductivity type in which the channel regions are provided and which forms a p-n junction with the substrate, said p-n junction being situated at a distance between 2 micrometers and 5 micrometers from the major surface.

In such a device, charge carriers which are generated in the substrate will not contribute to the photo current and hence provide no contribution to the video signal. Charge carriers which are generated at a distance of 2-5 micrometers from the surface are formed in particular by absorption of red light for which silicon is comparatively readily pervious. The generation of charge carriers as a result of exposure to blue and green light takes place substantially down to depths of approximately 0.1 micrometer and approximately 1 micrometer, respectively.

In addition, the sensitivity to longer wavelengths in silicon differs considerably from the sensitivity curve of the human eye. As a result of providing the above-described p-n junction, the influence of long-wave radiation is substantially eliminated so that the sensitivity of the device is better adapted to that of the human eye. This is of importance in particular for image sensor devices in behalf of colour picture display. Moreover, as a result of this measure the occurrence of "smearing effects" is strongly reduced.

A method of manufacturing such an image sensor device in which the semiconductor body is provided at a major surface with charge transport channels separated from each other by channel bounding regions and the system of electrodes is provided on an insulating layer covering the major surface is characterized in that the channel bounding regions are formed at least partly by means of ion implantation using the electrode system as a mask.

BRIEF DESCRIPTION OF THE DRAWING

The invention will now describe in greater detail with reference to an embodiment and the drawing, in which.

Figure 1:
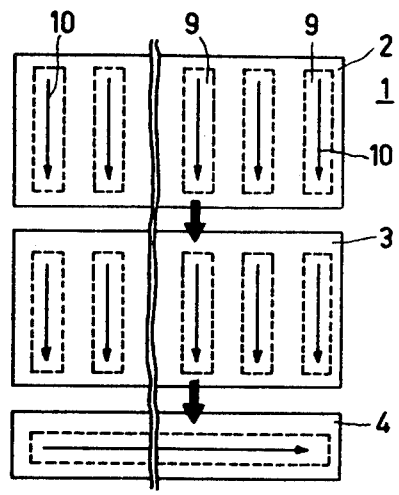
FIG. 1 shows diagrammatically the basic circuit of a charge-coupled image sensor device to which the invention relates.

The figures are diagrammatic and not drawn to scale in which for clarity the dimensions in particular in the direction of thickness are strongly exaggerated in the cross-sectional views. Semiconductor zones of the same conductivity type are generally shaded in the same direction; in the various embodiments corresponding parts are generally referred to by the same reference numerals.

DESCRIPTION OF THE PREFERRED EMBODIMENT

FIG. 1 shows a basic circuit diagram of a charge-coupled image sensor device 1 of the so-called framefield transfer type. Such an image sensor device comprises a radiation-sensitive pick-up part 2 in which during a certain exposure period a pattern of electric charge carriers corresponding to the radiation image is formed. After the exposure period the pattern of electric charge carriers is stored temporarily in a memory part 3 from which the pattern is read sequentially by means of a shift register 4. For reading, use may be made of methods known per se.

The image sensor device (FIGS. 2–5) comprises a semiconductor body 5 which is built up, for example, from a silicon substrate 6 of the n-type having a resisitivity of approximately 10 Ohm·cm (approximately $5 \cdot 10^{14}$ donor atoms/cm$^3$) and a p-type region 7 provided thereon and having a doping of approximately $3 \cdot 10^{15}$ acceptor atoms/cm$^3$. The p-type region 7 is provided, for example, by means of epitaxial growth or by means of implantation, followed by diffusion. At the major surface 8 of the semiconductor body 5 a number of charge transport channels (referred to by reference numeral 9 in FIG. 1) separated from each other and extending substantially parallel are defined in which charge transport takes place, in the direction shown diagrammatically by means of arrows 10 in FIGS. 1 and 2. In the present case the charge coupled device or ccd is formed by a ccd with bulk transport (pccd or bccd). The charge transport channels re formed by n-type regions 11 which are separated from each other by p-type channel bounding regions 12 and underlying n-type regions 25. The n-type regions 11, 25 in this example have an average impurity concentration of approximately $10^{16}$ atoms/cm$^3$ and are approximately 1 micrometer deep, while their width is approximately 10 micrometers. The p-type regions 12 at the surface 8 have a concentration of approximately $10^{18}$ acceptor atoms/cm$^3$ while the width of these regions at the surface is approximately 5 micrometers and they penetrate into the semiconductor body 5 down to a depth of approximately 0.5 micrometer.

The major surface 8 is covered with a layer 13 of insulating material, for example silicon oxide. On this insulating layer 13 a first set of electrodes is provided by means of which potential wells in the semiconductor material can be generated in behalf of charge transport and charge storage.

The electrodes 15, 16 of this first set are insulated from each other and extend in a direction transverse to the direction of the charge transport channels.

As a material for the electrodes may be chosen, for example, polycrystalline silicon. Because polycrystalline silicon is comparatively poorly permeable to short-wave (blue) light, the electrode system comprises windows 14 which in this example have a rectangular shape. Via these windows 14, the blue light can penetrate into the semiconductor body 5 and generate charge carriers there.

According to the invention the system of electrodes for that purpose includes a second set of electrodes 18. Each electrode 18 is associated with one charge transport channel 9, 11 and extends above said channel 9, 11 in a direction parallel to the charge transport direction, indicated by the arrows 10 in FIGS. 1 and 2. The electrodes 18 extend transversely to the electrodes 15, 16 and thus bound the radiation-pervious windows 14 in the longitudinal direction of the channels 11, while the electrodes 15, 16 bound the windows 14 in the transverse direction of the channels 11. The electrodes 18 cover the charge transport channels 11 entirely, so that, when charge is transported below said electrodes, no loss in transport efficiency occurs. In this example the electrodes 18 constitute together with the electrodes 15 and 16 an electrode system for a three-phase clock system above the channels 11.

In the device shown the electrodes 18 are connected together at places outside the windows 14 by means of connection elements 19 which are preferably provided transversely to the electrodes 18. The total system 17 of electrodes 18 thus obtains a shorter response time while in addition the connection of the electrode system 17 can be provided beside the connection for the electrodes 15, which is advantageous from a point of view of designing.

In the present example the electrodes 18 insofar as they are present between the windows 14 viewed in the direction parallel to the direction of transport are longer than in the direction transversely thereto. The latter dimension is also determined by the required resolution and the permissible area of the image sensor device. Dependent on the size of the charge packets to be transported, for a given dimension in the direction of transport, such a favourable area of the window can be chosen that the sensitivity of the device for blue light is optimum.

It is to be noted that the image sensor device shown does not have the usual anti-blooming buses between the channels 9, 11. Blooming can be prevented by draining excess charge carriers by means of recombination via surface states, as described in the simultaneously filed Netherlands Patent Application No. 8000998 which corresponds to U.S. patent application No. 231,649, filed Feb. 5, 1981.

After the integration period, the pattern of charge packets corresponding to the radiation or exposure pattern is transferred to the memory part 3, as already noted. This memory part 3 need not receive any radiation and need hence not be provided with windows either so that as a whole it can occupy a much smaller area than the pick-up portion 2. The pattern is read sequentially from the memory part 3 by means of the shift register 4 (FIG. 1).

During operation of the charge-coupled image sensor device charge carriers are generated in the radiation sensitive pick-up portion 2 during the integration period. In the cross-sectional view of FIG. 4 the incident radiation is denoted by arrows 20.

Blue light, which can reach the silicon surface 8 unhindered via the windows 14, mainly generates charge carriers down to a depth of approximately 0.1 micrometer. In the device shown in FIG. 4 said charge carriers are generated substantially only in the p-type regions 12. The holes generated as a result of said radiation remain behind in the p-type regions 12, while the generated electrons are distributed over the adjacent charge transport channels, in the FIG. 4 device defined by the n-type regions 11, for example, in that such a voltage is provided on the electrode 18 or on the electrodes 15, 16 that potential wells for electrodes are formed in the charge transport channels below the electrodes 15, 16 or 18.

Green light reaches the surface also outside the windows 14 and mainly generates charge carriers down to a depth of approximately 1 micrometer. The charge carriers generated in the charge transport channels move to the nearest potential wells in the channels in question. For charge carriers generated in or below the channel bounding areas, the electrons move to the potential wells in the adjacent channel regions 11, while the holes are drained via the channel bounding regions 12 or via the p-layer 7.

Figure 2:
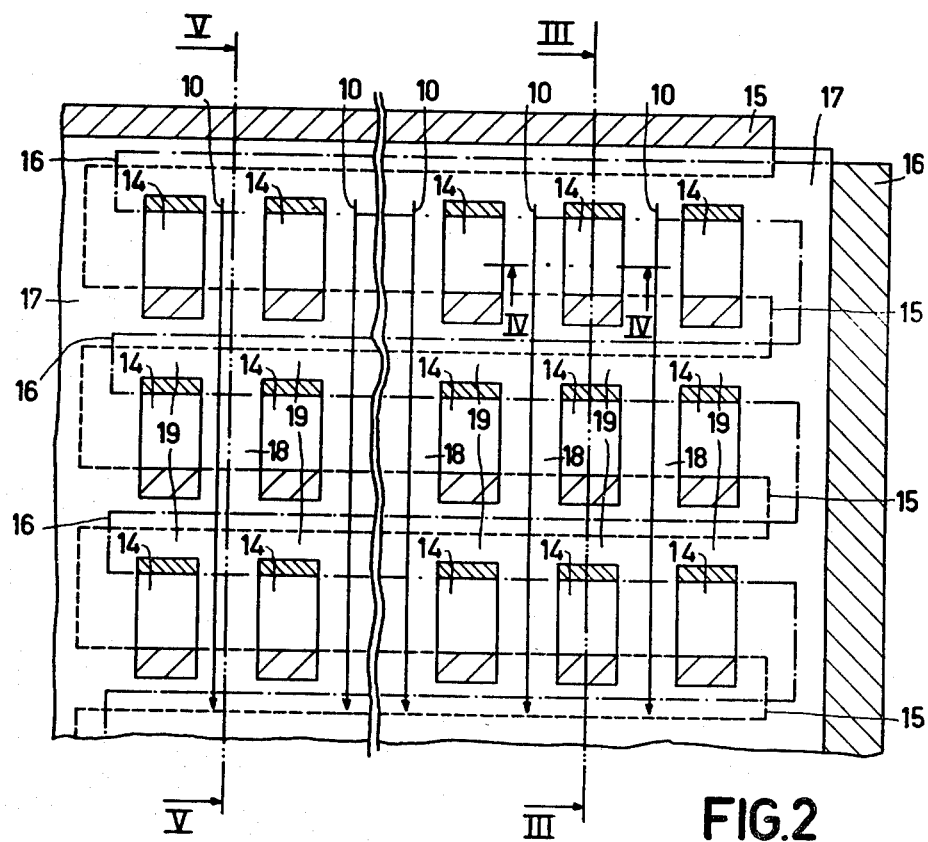
FIG. 2 is a diagrammatic plan view of a part of the radiation-sensitive part of such an image sensor device.
Figure 6:
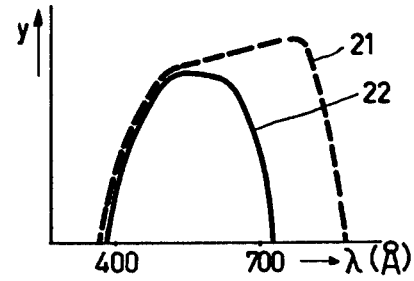
FIG. 6 shows a qualitative picture of the radiation-sensitivity of a device according to the invention compared with that of the human eye, and FIGS. 7a, 8a, 9a and FIGS. 7b, 8b, 9b, and 10, respectively, show the semiconductor device of FIG. 3 and FIG. 4, respectively, during various stages of manufacture.
Figure 5:
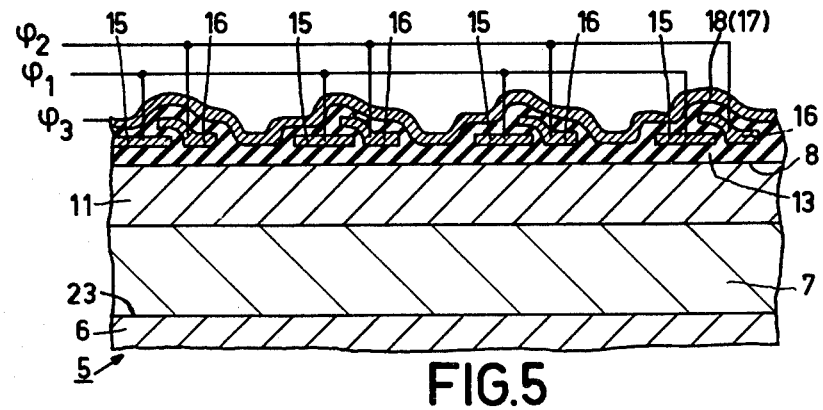
FIG. 5 is a diagrammatic cross-sectional view of the image sensor device taken on the line V—V of FIG. 2.

In the case of still higher wavelengths of the incident light, the photosensitivity of the silicon, measured as the quantity of generated charge carriers, begins to differ considerably from the photosensitivity of the human eye. This is shown in FIG. 6 in which the photosensitivity y of silicon is shown as a function of the wavelength $\lambda$ of the incident light by means of the curve 21. Curve 22 of FIG. 2 shows for comparison the photosensitivity of the human eye. It appears from FIG. 6 that notably the red sensitivity of silicon is much greater than that of the human eye.

In the example shown of the charge-coupled image sensor device 1, the p-n juntion 23 between the substrate 6 and the p-type layer 7 is at approximately 3.5 micrometers from the major surface 8. Red light in silicon substantially generates charge carriers down to a depth of approximately 10 micrometers. When no special measures are taken, these charge carriers diffuse through the semiconductor body; in this manner the electrons generated in the semiconductor body can be trapped in potential minima which are created at a distance of a few tens of micrometers from the place of the incident light by the electrode system and thus provide an undesired signal contribution to charge transport channels situated farther away. By providing the p-n junction 23 at a depth of approximately 3.5 micrometers, electrons which are generated at a depth of, for example, 3 micrometers or more, are trapped substantially in the substrate 6 so that the contribution of the red light and notably longer-wave radiation to the sensitivity curve of the charge-coupled image sensor device is reduced and the overall sensitivity curve of the device approaches more that of the human eye. Simultaneously it is achieved by means of this measure that electrons which are generated by incident red light do not or hardly contribute to signals of charge transport channels other than the adjacent ones. As a result of this, so-called "smearing effects" are prevented.

Figure 3:
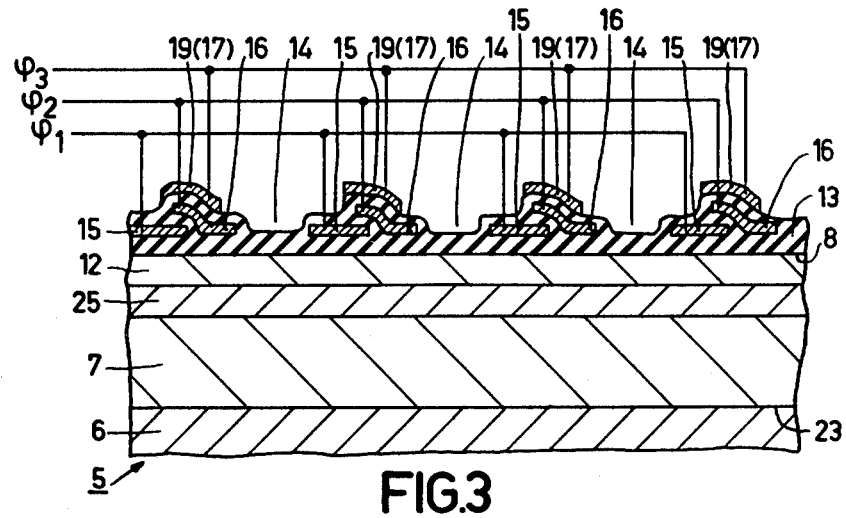
FIG. 3 is a diagrammatic cross-sectional view of the image sensor device taken on the line III—III of FIG. 2.
Figure 4:
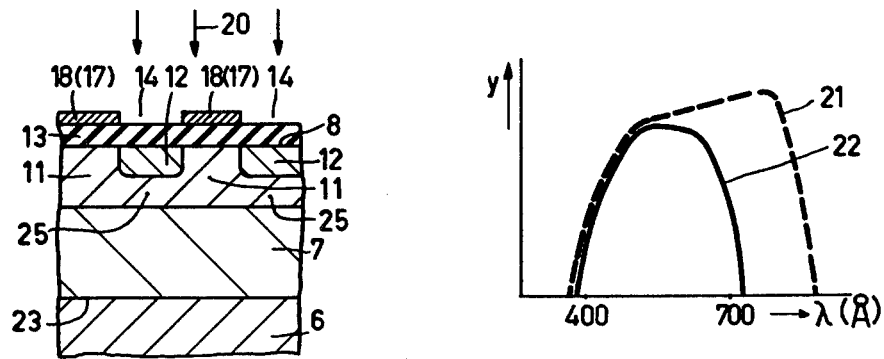
FIG. 4 is a diagrammatic cross-sectional view of the image sensor device taken on the line IV—IV of FIG. 2.

The semiconductor device as shown in FIGS. 3 and 4 can be manufactured as follows (FIGS. 7 to 10).

Starting material is an n-type silicon substrate 6 having a thickness of approximately 400 micrometers and a resistivity of approximately 10 Ohm·cm, which corresponds to an impurity concentration of approximately $5 \cdot 10^{14}$ donor atoms/cm$^3$ on which by means of implantation and diffusion a layer 7 of the p-type is then provided at a thickness of approximately 4.5 micrometers and an impurity concentration of approximately $3 \cdot 10^{15}$ acceptor atoms/cm$^3$, which corresponds to a resistivity of approximately 5 Ohm·cm (FIGS. 7a, 7b). The n-type region 11, 25 having a thickness of approximately 1 micrometer is then provided also by means of implantation and diffusion in such manner that the ultimate average concentration of donor atoms in this region is aproximately $10^{16}$ atoms/cm$^3$. Regions 12a are also provided, for example by implantation, down to a depth of approximately 0.5 micrometer. These regions have an average impurity concentration of approximately $3 \cdot 10^{17}$ atoms/cm$^3$. Herewith the device shown in FIGS. 8a, 8b is obtained. The channel bounding areas 12 are defined substantially entirely by said regions 12a.

The major surface 8 is then provided with a layer of oxide in a thickness of approximately 0.1 micrometer, for example, by thermal oxidation. Hereon a layer of polycrystalline silicon is provided at a thickness of approximately 0.6 micrometer. In order to make said layer readily conductive, it is doped with, for example, donor atoms during or after the deposition. From this layer of polycrystalline silicon, the electrodes 15 of the electrode system are formed by means of known etching methods. The oxide not covered by polycrystalline silicon is then removed by means of known etching methods and again a layer of oxide is provided after which a second layer of polycrystalline silicon is provided. From this second layer the electrodes 16 of the electrode system are formed. The oxide not covered by polycrystalline silicon is then removed again and then a layer of oxide is provided again. Herewith the insulating layer 13 is complete. In order to complete the device, the whole surface area is now covered with a layer of conductive material, for example, doped polycrystalline silicon having a thickness of approximately 0.4 micrometer. By means of known etching methods, the electrodes 18 and the transverse connections 19 of the electrode system 17 are formed from said conductive layer (FIGS. 9a, 9b), Herewith the device shown in FIGS. 3 and 4 is basically completed.

In order to prevent that as a result of possible alignment errors during the manufacture the edges of the regions 12a do not coincide entirely with the edges of the windows 14, an extra implantation step is preferably carried out through the window 14 with the electrodes 15, 16 of polycrystalline silicon and the electrodes 18 as masks so that the windows 14 are situated entirely above p-type channel bounding areas 12. The implantation, denoted diagrammatically in FIG. 10 by the arrows 24, takes place with an energy of, for example, 80 keV and an average intensity of approximately $10^{13}$ ions/cm$^2$. As a result of this implantation, edge regions 12b are formed which together with the regions 12a at the area of the windows 14 constitute adjoining p-type channel bounding regions 12, above which the windows 14 are situated entirely.

Of course the invention is not restricted to the above example but many variations are possible to those skilled in the art without departing from the scope of this invention. For example, the connection elements need not be provided at right angles to the electrode strips 18 but they may cross these at a certain angle. Instead of two elements 15, 16, three elements in a direction transverse to the direction of transport and the electrode strips transverse to said elements may be provided so that a device for a 4-phase clock system is obtained. In addition, other types of transport devices may be used, for example, bucket brigade registers and surface ccd's. Various variations are also possible in the method.

What is claimed is:

1. A charge coupled image sensor device for receiving a radiation image and converting it into an electrical signal, wherein a number of substantially parallel charge transport channels spaced apart from one another are situated in a semiconductor body along a major surface thereof, the body has channel bounding regions which laterally bound the channels along substantially their entire lengths so as to electrically separate them, an electrode system for controlling charge transport in the channels lies on an insulating layer at the major surface and has windows for allowing in particular short-wave light of the radiation image to penetrate into the body and generate charge carriers therein, and a group of first electrodes in the system extends across all of the channels substantially transverse to their longitudinal direction, characterized in that the system includes a group of second electrodes situated apart from one another above the channels, that each second electrode extends along substantially the entire length of a different one of the channels, that the second electrodes together with the first electrodes are not present at the windows, and that the channel bounding regions are situated below substantially the entire areas of the windows.

2. A device as in claim 1 characterized in that the electrode system further includes connection elements for connecting the second electrodes together.

3. A device as in claim 2 characterized in that the connection elements extend above the body between the windows to adjoin consecutive second electrodes substantially transverse to said longitudinal direction.

4. A device as in claim 2 characterized in that the electrode system is a three-phase electrode system.

5. A device as in claim 3 characterized in that parts of the second electrodes bound the windows along their entire lengths in said longitudinal direction and that the dimension of each of these parts is greater in said longitudinal direction than transverse thereto.

6. A device as in claim 1 characterized in that the body comprises a semiconductor substrate of one conductivity type and an overlying semiconductor region of the opposite conductivity type containing the channels and adjoining the substrate to define a p-n junction which is 2–5 micrometers below the major surface.

* * * * *